US009553181B2

(12) United States Patent
Yang

(10) Patent No.: US 9,553,181 B2
(45) Date of Patent: Jan. 24, 2017

(54) CRYSTALLINE-AMORPHOUS TRANSITION MATERIAL FOR SEMICONDUCTOR DEVICES AND METHOD FOR FORMATION

(71) Applicant: Toshiba Corporation, Minato-ku, Tokyo (JP)

(72) Inventor: Long Yang, Union City, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/727,389

(22) Filed: Jun. 1, 2015

(65) Prior Publication Data
US 2016/0351698 A1 Dec. 1, 2016

(51) Int. Cl.
| | |
|---|---|
| *H01L 21/338* | (2006.01) |
| *H01L 29/778* | (2006.01) |
| *H01L 29/66* | (2006.01) |
| *H01L 29/205* | (2006.01) |
| *H01L 29/20* | (2006.01) |
| *H01L 21/02* | (2006.01) |

(52) U.S. Cl.
CPC ....... *H01L 29/778* (2013.01); *H01L 21/02271* (2013.01); *H01L 21/02538* (2013.01); *H01L 29/205* (2013.01); *H01L 29/2006* (2013.01); *H01L 29/66462* (2013.01)

(58) Field of Classification Search
CPC .................................................... H01L 29/778
See application file for complete search history.

(56) References Cited

U.S. PATENT DOCUMENTS

| | | |
|---|---|---|
| 8,803,158 B1 | 8/2014 | Chiu et al. |
| 2002/0033521 A1 | 3/2002 | Matsuoka |
| 2011/0143538 A1* | 6/2011 | Liu ..................... C23C 18/1605 438/675 |
| 2012/0091522 A1 | 4/2012 | Ozaki et al. |

(Continued)

FOREIGN PATENT DOCUMENTS

| | | |
|---|---|---|
| JP | 2005-183597 A | 7/2005 |
| JP | 2014-135347 A | 7/2014 |
| WO | 2012/172753 A1 | 12/2012 |

OTHER PUBLICATIONS

S. Huang et al., "Effective Passivation of AlGaN/GaN HEMTs by ALD-Grown AlN Thin Film," in IEEE Electron Device Letters, vol. 33, No. 4, pp. 516-518, Apr. 2012.

(Continued)

*Primary Examiner* — Vongsavanh Sengdara
(74) *Attorney, Agent, or Firm* — White & Case LLP

(57) ABSTRACT

The present disclosure presents a novel structure for a dielectric material for use with Group III-V material systems and a method of fabricating such a structure. More specifically, the present disclosure describes a novel dielectric layer that is formed on the top surface of a III-V material where the dielectric layer comprises a first region in contact with the top surface of the III-V material crystalline and a second region adjacent to the first region and at the upper side of the dielectric layer. The dielectric layer has material properties different from traditional dielectric layers as it is composed of both crystalline and amorphous structures. The crystalline structure is at the interface with the III-V material (such as AlGaN or GaN) but gradually transitions into an amorphous structure, both within the same layer and both comprising the same material.

9 Claims, 10 Drawing Sheets

(56) References Cited

U.S. PATENT DOCUMENTS

2013/0026486 A1 1/2013 Miyoshi et al.
2015/0060873 A1* 3/2015 Chiu .................... H01L 29/778
 257/76

OTHER PUBLICATIONS

Taiwanese Office Action issued on Aug. 4, 2016 in corresponding Taiwanese Application No. 104126433, along with English translation thereof.
Japanese Notification of Reasons for Refusal issued in corresponding Japanese Application No. 2016-004264 dated Nov. 29, 2016 along w/English translation thereof.

* cited by examiner

CRYSTALLINE-AMORPHOUS TRANSITION MATERIAL FOR SEMICONDUCTOR DEVICES AND METHOD FOR FORMATION

FIELD OF THE INVENTION

The present disclosure relates to a novel structure for a dielectric material and a method of fabricating the structure for use with a Group III-V material (such as gallium nitride (GaN), indium phosphide (InP) and gallium arsenide (GaAs)), metal-oxide semiconductor field-effect transistor (MOSFET) and high-electron-mobility transistor (HEMT) devices.

BACKGROUND OF THE INVENTION

The success of silicon MOSFET devices is largely built upon the fact that high-quality dielectric materials can be deposited on a silicon substrate without a high interface charge between the dielectric material and the silicon. High interface charges are undesirable because these charges can negatively affect the density of electrons at the interface of the silicon and dielectric materials, which in turn, can lead to inconsistent and unreliable deposition of the dielectric material. A dielectric material, such as silicon dioxide ($SiO_2$), may be formed on a silicon crystal with a highly reliable crystalline interface and an extremely low interface charge density. These properties allow for the precise control of a threshold voltage when $SiO_2$ is used as a gate dielectric, allows for consistent and reliable processing of a MOSFET device. Dielectric materials are necessary to isolate connecting metals within a silicon MOSFET device. As such, the interface charge between the silicon in the MOSFET device and the dielectric materials has to be low enough to avoid affecting the density of electrons, which could reduce the effectiveness of the MOSFET's operations. Silicon is popular because its properties help achieve this goal.

There has been research into replacing silicon with Group III-V materials. A Group III-V material refers to a material that includes at least one element from Group III of the periodic table of elements and at least one element from Group V of the periodic table of elements. By replacing silicon, semiconductor devices using Group III-V materials offer advantages such as higher electron mobility, higher electric breakdown field, and larger band-gap. These advantages make Group III-V material systems suitable for high voltage and high temperature operation. For example, in a high voltage field effect transistor (FET), the typical voltage applied across the gate and the source could be quite small (from −20V to +10V) while the voltage across the drain and the source can vary widely (from 0V to >5000V), depending on the applications. To sustain such a high voltage, Group III-V materials with a high breakdown field such as GaN offer advantages over semiconductors such as silicon.

However, forming reliable Group III-V material systems for high-voltage applications is not without significant challenges. Unlike silicon, which is a pure (i.e., non-polar) material system and having inversion symmetry, a Group III-V material is a polar compound where electrons are more attracted to the Group V material than the Group III material. When dielectric materials are deposited onto Group III-V materials, the polarity of such materials creates an undesirable high interface charge density at the interface between the Group III-V material and the deposited dielectric material.

Typically, most of the polarization of the III-V material can be contained within the crystalline structure, but at the termination point of the crystalline structure (e.g., the surface of the III-V material), dangling bonds induce surface states (resulting in very high surface charge densities) between the III-V material and the surface of the deposited dielectric material. Therefore, conventional dielectric materials such as SiO2 or Silicon Nitride ($Si_3N_4$) are not compatible with III-V materials.

As a result of these properties of Group III-V materials, $SiO_2$ or another oxide-based dielectric material deposited on top of Group III-V materials such as Aluminum Gallium Nitride (AlGaN) or GaN causes the oxide-based dielectric material to react with the dangling bonds on the surface of the III-V material resulting in a hard-to-control interface leading to non-uniformity. Non-uniformity is undesirable because it causes random defects and trapped charges at the interface between the dielectric layer and the substrate leading to uncertain conditions for further processing of the substrate. Consequently, it is difficult to fabricate a high performance semiconductor device on a Group III-V substrate using an oxide-based dielectric on a large scale.

Furthermore, the charge density at the interface is highly sensitive to the deposition conditions and surface cleaning methods. Because of the sensitivity of the deposition process to these factors, repeatability of the deposition process between conventional dielectric materials and Group III-V materials is not reliable, which in turn causes large threshold voltage variation either across the wafer or between wafers.

The commercialization of Group III-V MOSFETs has been further hampered by the lack of availability of a stable gate oxide and stable passivation material. Another issue is the lack of a repeatable and reliable dielectric material for Group III-V material systems.

Therefore, what is needed is a way to resolve the issues arising from the surface charges of the of Group III-V materials.

SUMMARY

The present disclosure describes a novel method of fabricating a single layer of dielectric material on a first Group III-V semiconductor layer. The method may comprise the step of forming the first Group III-V material semiconductor layer. This first Group III-V material semiconductor layer may be formed on a Group III-V material substrate having a similar lattice constant, a silicon substrate, or other host substrates such as sapphire. Another step of the method may comprise forming the single layer of dielectric material on the first Group III-V material semiconductor layer where the single layer of dielectric material comprises a first and second region. The first region of the dielectric material is located at a lower surface of single layer of dielectric material and at an interface between the single layer of dielectric material and the first Group III-V material semiconductor layer. The second region of the dielectric material may be adjacent to the first region and located at an upper surface of the single layer of dielectric material. Both first and second regions are within the single layer of dielectric material and the first region transitions to a second region. The first region may have a crystalline structure and the second region may have an amorphous structure. In accordance with one embodiment, the dielectric material layer is created where the single layer of dielectric material comprises a crystalline region and an amorphous region. This type of structure is different from what is well-known as a poly-crystalline structure that comprises various crystalline domains, with random crystalline orientation, separated by domain boundaries.

The present disclosure also describes a novel semiconductor structure that comprises a first Group III-V material semiconductor layer. The first Group III-V material semiconductor layer may be formed on a substrate. The semiconductor structure further comprises a single layer of dielectric material formed on the first Group III-V material semiconductor layer. The single layer of dielectric material further comprises a first region and a second region. The first region of the single layer of dielectric material may have a crystalline structure. The first region may be adjacent to a lower surface of the single layer of dielectric material and to an interface between the single layer of dielectric material and the second Group III-V material semiconductor layer. The second region of the single layer of dielectric material is adjacent to an upper surface of the single layer of dielectric layer material, and has an amorphous structure. In one embodiment, the dielectric material layer comprises a crystalline region and an amorphous region within the single layer of dielectric material.

DETAILED DESCRIPTION OF THE INVENTION

The present disclosure, which describes a unique structure for dielectric material deposited on a Group III-V material system for Group III-V HEMT devices and a method for fabricating such a device and the dielectric material, will now be discussed in detail with reference to the drawings that accompany the present application. It is noted that the drawings are provided for illustrative purposes only and are not drawn to scale.

The following description sets forth numerous details with respect to particular structures, materials, dimensions, and method steps, in order to illustrate various features of the present disclosure. However, it will be appreciated by one of ordinary skill in the art that various embodiments of the present disclosure may be practiced using other types of similar structures, materials, dimensions and steps.

Figure 1A:
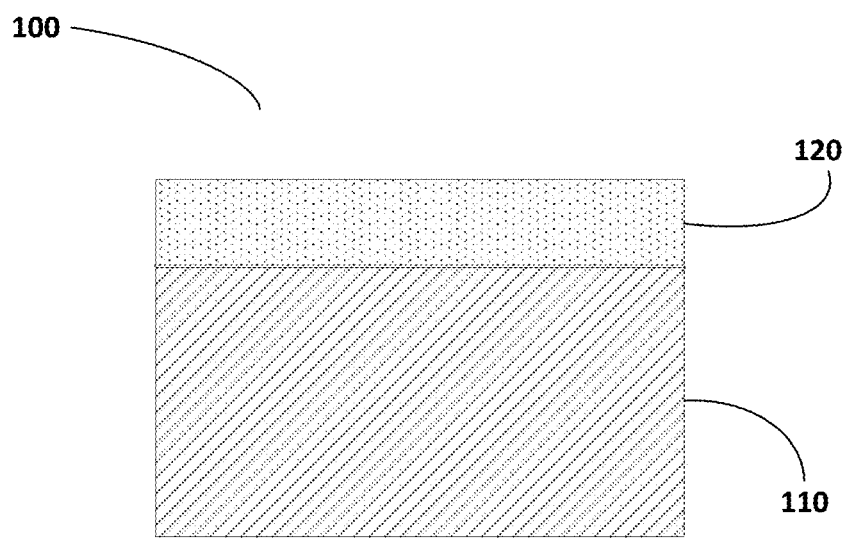
FIG. 1A is a cross-sectional view of a semiconductor structure in accordance with an embodiment.
Figure 1B:
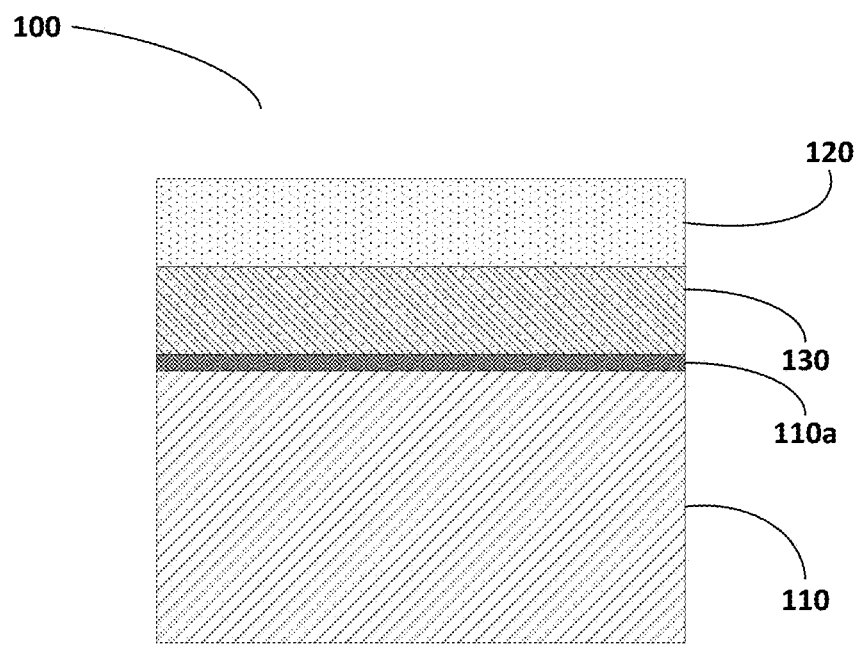
FIG. 1B is a cross-sectional view of a second semiconductor structure in accordance with an embodiment.
Figure 1C:
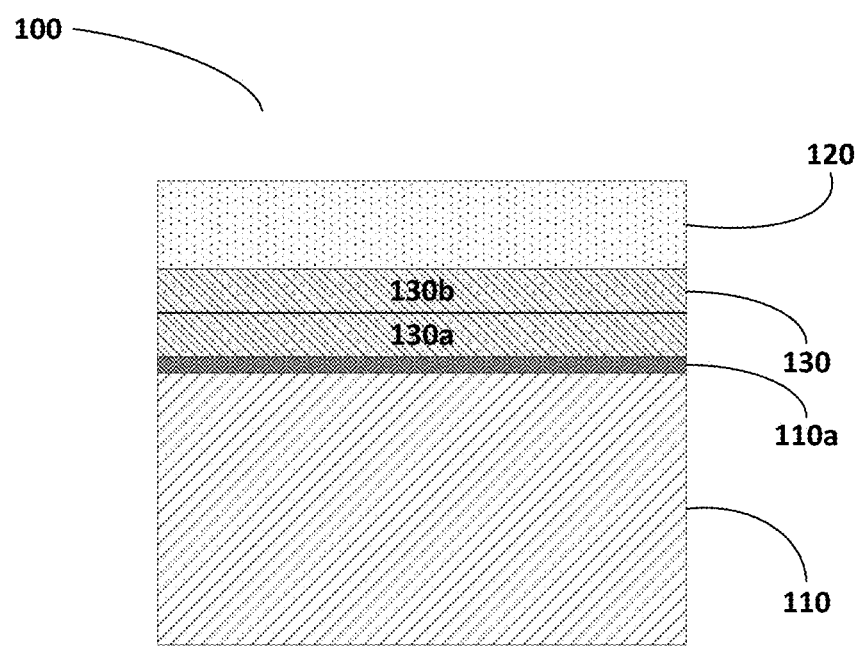
FIG. 1C is a cross-sectional view showing a second semiconductor structure in accordance with an embodiment.

FIGS. 1A, 1B, and 1C show a Group III-V material crystalline semiconductor structure 100 having a first layer 110, which may comprise a Group III-V material such as gallium nitride (GaN), and a dielectric layer 120. FIG. 1A illustrates the semiconductor structure 100 composed only of a first layer 110. FIG. 1B shows another embodiment of the semiconductor structure 100 having a second layer 130, which may also comprise an III-V material, adjacent to the first layer 110. The first layer 110 and the second layer 130 may each comprise one layer or multiple sub-layers of Group III-V material. For example, as shown in FIG. 1C, the second layer 130 may comprise a first sub-layer of III-V material 130a (e.g., AlGaN) and a second sub-layer of Group III-V material 130b (e.g., GaN). The second layer 130 is not limited to only the number of sub-layers shown but may comprise additional sub-layers comprising Group III-V material. For illustrative purposes only, the remainder of this disclosure will describe first layer 110 as comprising GaN and second layer 130 as comprising AlGaN. However, it should be noted that any Group III-V materials could be used for the first layer 110 and second layer 130 and is not merely limited to GaN and AlGaN. Moreover, first layer 110 may also comprise other materials. For example, first layer 110 may also comprise a GaN material that is grown on a (111) silicon substrate.

Referring back to FIG. 1B, the III-V semiconductor structure 100 may comprise first layer 110 and a second layer 130 formed on top of the first layer 110. In this configuration, the first layer 110 may be in an [1000] crystal orientation. If the substrate is oriented in this manner, there is a spontaneous polarization difference between the first layer 110 and the second layer 130 which induces a sheet of electrons (two-dimensional electron gas, 2DEG) 110a formed at the interface between the first layer 110 and the second layer 130. The polarization difference between the first layer 110 and the second layer 130 is a result of the difference in materials of the first layer 110 and the second layer 130. The 2DEG region 110a has a high electron mobility that facilitates low channel resistance, high-speed switching during device operation, and allows current to flow along the interface of first layer 110 and second layer 130.

Here, the concentration of the 2DEG region 110a is a function of the composition of the second layer 130. For example, an increase of Al in the AlGaN of second layer 130 will increase the concentration of the 2DEG region 110a. This increase occurs because a higher amount of Al in the AlGaN material causes an increase in polarization difference between the interface of the first layer 110 and the second layer 130. The increased difference of polarization gives rise to an apparent positive sheet charge that causes the increase in the concentration of the 2DEG region 110a. Alternatively, 2DEG can be increased or reduced by the doping in layer 130.

Figure 5:
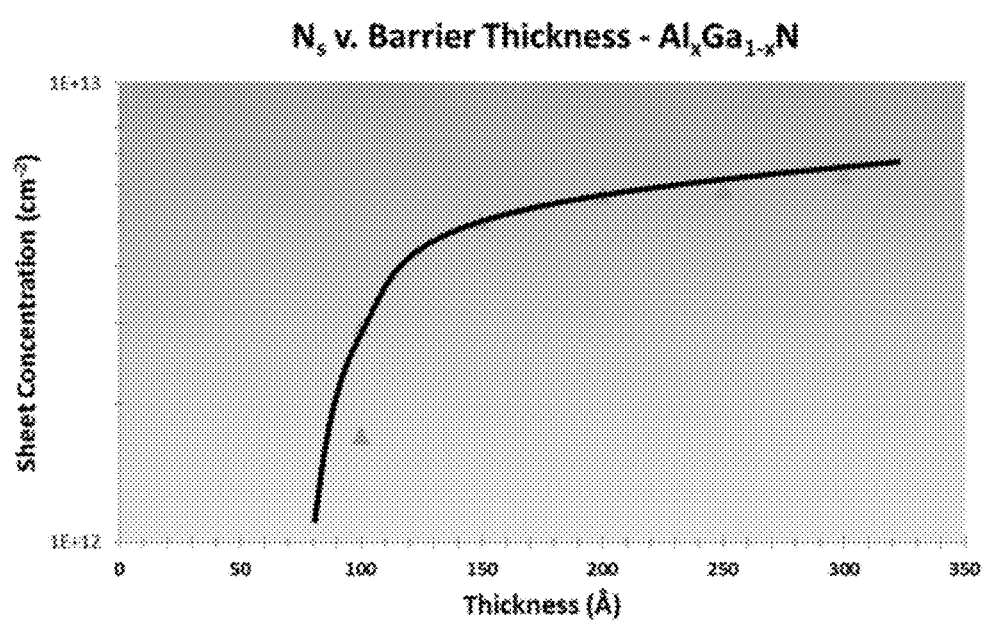
FIG. 5 shows the relationship between the concentration of the 2DEG as a function of the Al composition and the thickness of AlGaN.

As an example, the concentration of 2DEG region 110a relative to the thickness of the second layer 130, and in which the Al composition (mole fraction) is 0.21 is shown in FIG. 5. A mole fraction represents the ratio of a number of moles of one Group III component to the total number of moles present in the Group III molecule.

Turning to FIG. 1C, the dielectric layer 120 is formed on first layer 110 because the second layer 130 is absent (as compared to FIG. 1B which illustrates the dielectric layer 120 being formed on top of the second layer 130). Illustrative examples of the dielectric material are aluminum nitride (AlN), aluminum gallium nitride ($Al_xG_{1-x}N$), indium gallium nitride ($In_xGa_{1-x}N$), aluminum arsenide (AlAs), and aluminum phosphate (AlP). For the purpose of illustration only, the remainder of this disclosure will describe the dielectric material of dielectric layer 120 as AlN but it is also possible to use other materials including arsenide and phosphide material systems. For example, AlAs or AlP may be used. One consideration for selecting the dielectric material is the variance in lattice mismatch between the dielectric material and the substrate material. The lattice mismatch is the driving force to transition from crystalline structure to amorphous structure. Therefore, it is desirable to choose materials that minimize the interface charges between the first layer 110 and the dielectric layer 120.

Figure 2:
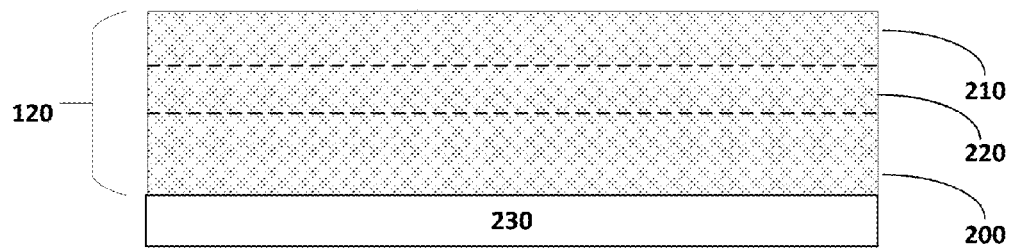
FIG. 2 is a cross-sectional view showing a dielectric layer in accordance with an embodiment.

FIG. 2 shows a cross-sectional view of the dielectric layer 120 in one embodiment. The dielectric layer 120 is a single layer comprising one type of material and having a crystalline region 200, an interfacial region 220, and an amorphous region 210. The crystalline region 200 is formed adjacent to and in contact with layer 230. Layer 230 may correspond to the second layer 130 of FIG. 1B or the first layer 110 of FIG. 1A. Layer 230 may also comprise Group III-V material. The crystalline region 200 is adjacent to the lower surface of the dielectric layer 120 and to the interface between the dielectric layer 120 and layer 230.

This dual nature of the dielectric layer 120 solves the issue of the polarization of the Group III-V surface. Crystalline region 200 of the dielectric layer 120 minimizes the high interface charges of layer 230 because crystalline region 200 has a similar crystalline structure as the underlying layer 230. On the opposing side of dielectric layer 120, amorphous region 210 provides a repeatable and reproducible surface onto which other materials can be deposited because, in contrast to the crystalline region 200, the amorphous region 210 has little to no surface charges or dangling bonds. Once the amorphous region 210 is formed, other materials can be easily deposited onto it without concern of the reactions caused the dangling bonds.

Between the crystalline region 200 and amorphous region 210 is interfacial region 220. The interfacial region 220 represents a transition from the crystalline region 200 of the dielectric material to the amorphous region 210 (all within the dielectric layer 120). Adjacent to the interfacial region 220 and the upper side of the dielectric layer 120 is the amorphous region 210. There should be an appropriate lattice mismatch between the dielectric material for the dielectric layer 120 and the underlying layer 230 in order to cause the crystalline region 200 to transition into an amorphous region 210. The amorphous region 210 comprises the same dielectric material as the crystalline region 200 but has an amorphous structure. The crystalline region 200 of the dielectric layer 120 may have a thickness of 5 nm (equivalent to about 20 monolayers of atoms) but this thickness may depend on the amount of mismatch between the lattice constant of the chosen dielectric material and the lattice constant of the underlying layer 230. The properties of the interfacial region 220, such as its dimensions and thickness, depend on the particular parameters of the deposition process, such as the temperature and selection of precursor gases, which will be discussed below with respect to FIG. 3. Therefore, the thickness at which the crystalline region 200 transitions to the amorphous region 210 may occur at a predetermined thickness based on the selected operating parameters of the deposition process.

Figure 3:
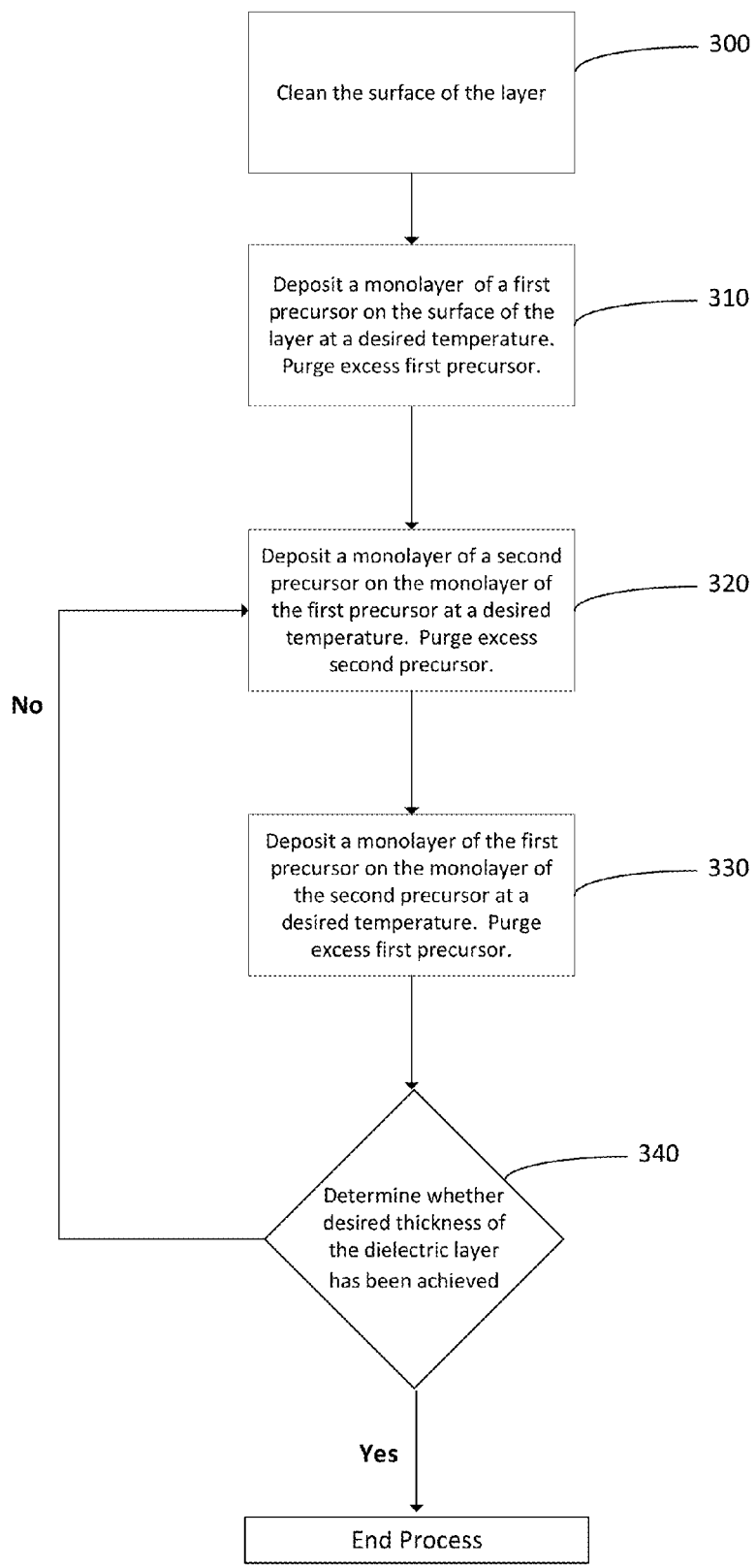
FIG. 3 shows the method steps for fabricating the semiconductor structure using atomic level deposition in accordance with an embodiment.

FIG. 3 shows the steps for forming a dielectric layer (e.g., dielectric layer 120 of FIG. 2) onto the Group III-V material in a manner that gives rise to the unique crystalline-amorphous structure described above. The steps shown in FIG. 3 will be discussed in combination with FIGS. 4A-C, which illustrate one embodiment of the steps of an atomic level deposition (ALD) process. Said process may take place in a reactor system and may occur at a temperature between 200 degrees Celsius to 500 degrees Celsius.

At step 300 of FIG. 3, the deposition process starts by cleaning the target surface. The target surface may be the first layer 110 of FIG. 1A or the second layer 130 of FIG. 1B. The cleaning step is necessary to achieve a crystalline structure because it removes any foreign materials at the surface of the target surface (e.g., layer 400 of FIG. 4A) that may be present on the surface because of environmental contamination or wafer handling. Step 300 may be performed either by wet chemical etch of native oxide and/or in-situ plasma clean just before the deposition. For the wet chemical etch, the surface of layer 400 may be treated with wet chemical cleaning to remove organic and/or inorganic materials. After the wet chemical etch, an in-situ surface clean by using reactive radicals (by plasma generation) or ion bombardment may be performed. For in-situ surface cleaning, the energy of the plasma and ions needs to be high enough to clean contaminants such as native oxide off layer 400 but not high enough to cause damage to the layer 400. Therefore, a remote plasma source may be preferred for this purpose.

Figure 4A:
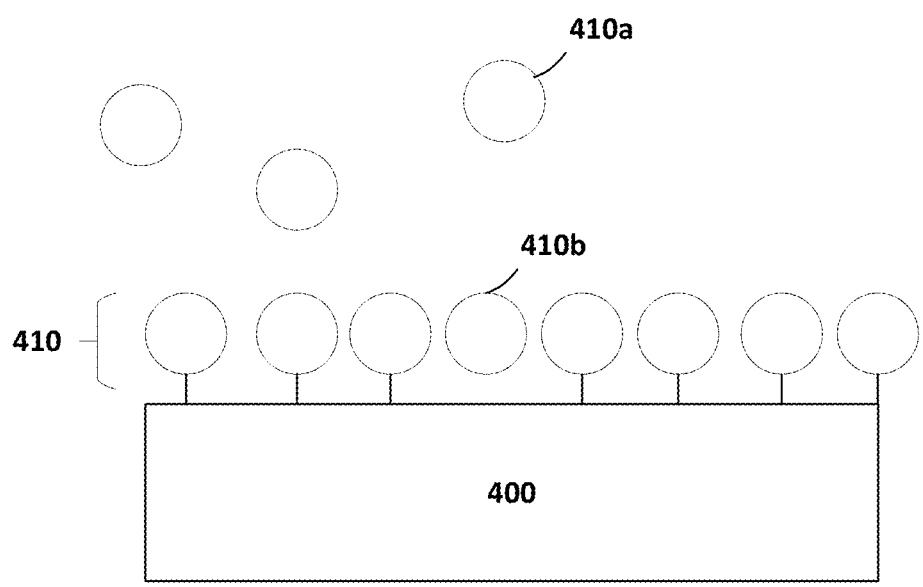
FIG. 4A illustrates one cycle of atomic level deposition using a first precursor in accordance with an embodiment.

Once the target surface is clean, at step 310, a monolayer of a first precursor is deposited on the surface of the target layer at a desired temperature, and excess first precursor is purged. FIG. 4A illustrates one embodiment of step 310 of FIG. 3. Here, FIG. 4A and step 310 of FIG. 3 represent a cycle in the ALD process. An ALD cycle consists of when the layer 400 has received a single exposure of one of the precursor and results in a layer having a thickness of a single atom or molecule, or a monolayer. Since a monolayer is deposited in each cycle, the precursors can be deposited onto the substrate with uniformity, which in turn allows for precise control over the materials deposited onto the substrate. More particularly, FIG. 4A involves introducing a first precursor (e.g., a gaseous species of an element that forms part of the dielectric layer) into the ALD system at a desired temperature. In one embodiment, the first precursor 410a is a nitrogen precursor, such as nitrogen gas, $N_2$.

Some first precursors react with the dangling bonds (not shown) on the cleaned surface of the layer 400 to result in the bonded first precursor monolayer 410. Excess precursors 410a remain unbonded. Step 310 therefore results in the formation of a monolayer 410 of the first precursor having a crystalline structure on the surface of the layer 400 and one or more excess precursors 410a.

FIG. 4A also illustrates the effect of having mismatched lattice constants between the precursor 410a and layer 400 in the form of a dislocation 410b. This dislocation 410b represents a precursor atom that does not form part of the crystalline structure of the monolayer 410. Dislocation 410b is a result of a mismatch between the lattice constants of the precursor 410a and the underlying Group III-V material of layer 400. At certain thicknesses, the layer 400 is able to tolerate a certain number of dislocations 410b and maintain the crystalline structure. The dislocations 410b shown in FIG. 4A (and subsequent figures) are merely for illustrative purposes, and are not necessarily intended to be realistic depictions. Further to step 310 of FIG. 3, any excess precursor 410a (as shown in FIG. 4A) is purged before moving to the next cycle.

Referring back to FIG. 3, at step 320, the ALD system exposes the monolayer to a second precursor. In one embodiment, the second precursor is an aluminum precursor, such as trimethylaluminum (TMA). When TMA reacts with the existing monolayer of the first precursor, a monolayer of a second precursor (e.g., made of aluminum) may be formed on the monolayer of the first precursor. In one embodiment, the monolayer of the first precursor and the monolayer of the second precursor combine to form a dielectric layer. Excess second precursor may be purged before forward with the deposition process.

Figure 4B:
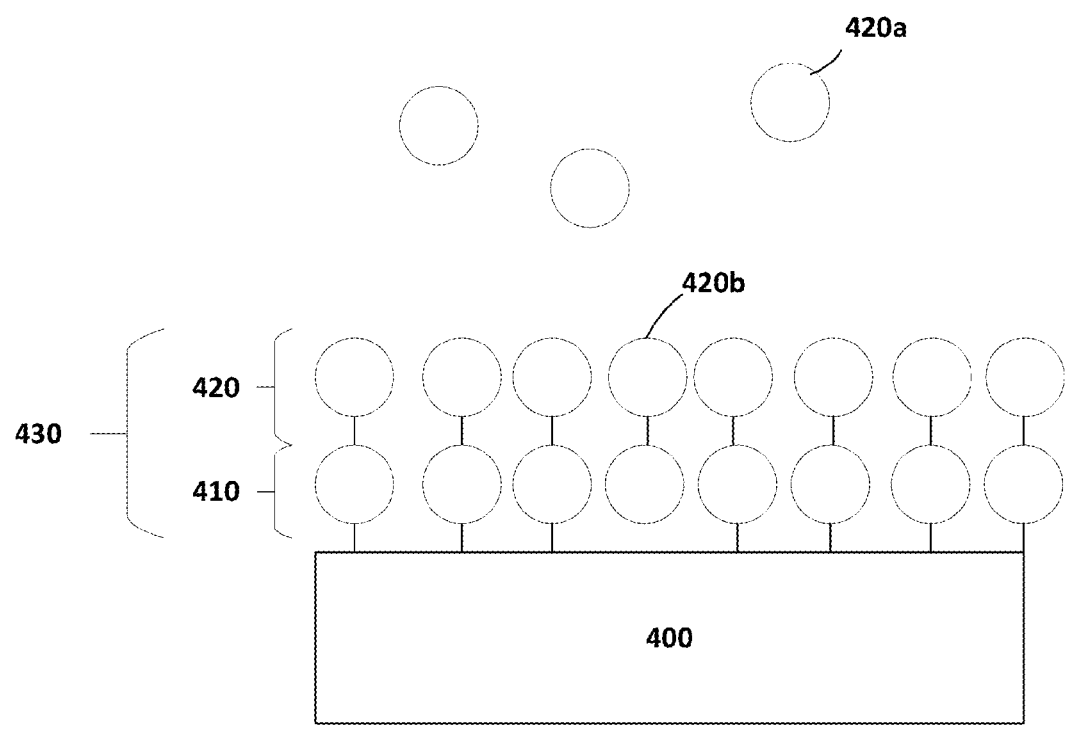
FIG. 4B illustrates one cycle of atomic level deposition using a second precursor in accordance with an embodiment.

One embodiment of step 320 of FIG. 3 is illustrated in FIG. 4B. As shown, the monolayer of the first precursor 410 is exposed to a second precursor 420*a*. When the second precursor 420*a* reacts with the monolayer 410, a monolayer of the second precursor 420 is formed (which results in the dielectric layer 430). FIG. 4B also shows an increased dislocation 420*b* that comprises the first precursor 410*a* (of FIG. 4A) and the second precursor 420*a*.

Referring back to FIG. 3, at step 330, the ALD system repeats the first cycle as described with respect to step 310 and again exposes the monolayer to the first precursor. As discussed with respect to step 310, the first precursor may be nitrogen gas, $N_2$. The first precursor reacts with the dielectric layer and may form another monolayer on top of the existing monolayer of the second precursor. In one embodiment, the monolayer of the first precursor, the monolayer of the second precursor, and the monolayer of the first precursor combine to form the dielectric layer. Excess first precursor may then be purged from the system.

Figure 4C:
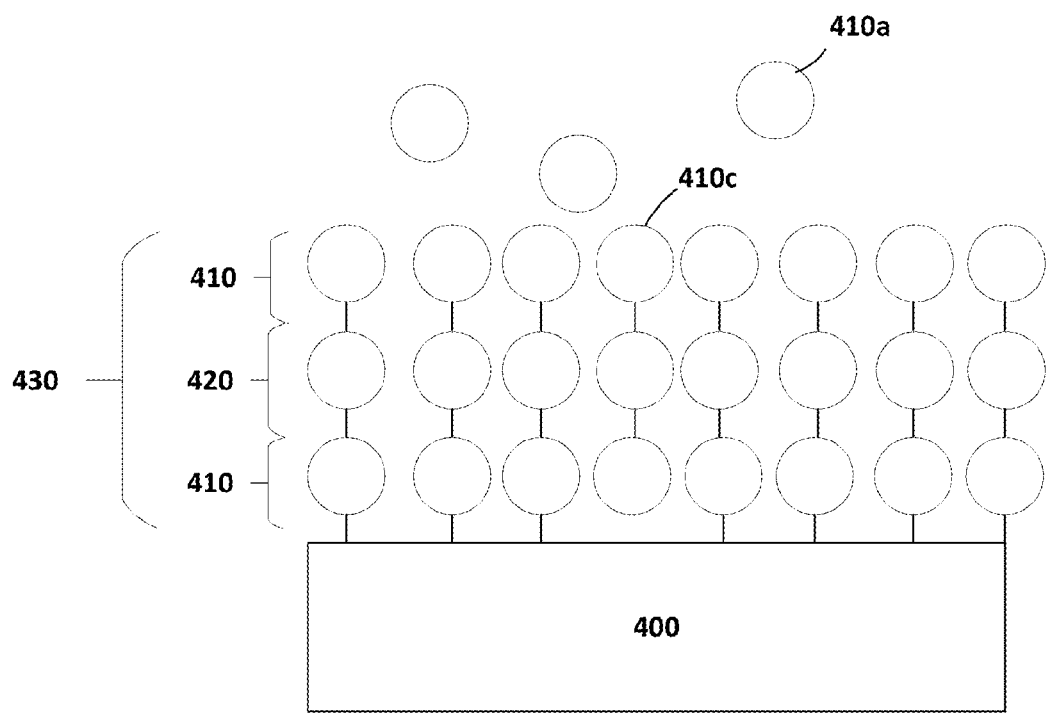
FIG. 4C illustrates one cycle of atomic level deposition using the first precursor in accordance with an embodiment.

One embodiment of step 330 of FIG. 3 is illustrated in FIG. 4C. The ALD system repeats the first cycle by exposing the layer 400, the monolayer 410 of the first precursor, and the monolayer 420 of the second precursor to the first precursor 410*a*. This results in another monolayer 410 of the first precursor 410*a* to be formed on the monolayer 420 of the second precursor 420*a*. The thickness of dielectric layer 430 is therefore increased by another monolayer. The size of dislocation 410*c* is also increased in comparison to dislocations 410*a* and 410*b* as shown in FIGS. 4A and 4B, respectively.

Referring back to FIG. 3, at step 340, a determination is made as to whether the desired thickness of the dielectric layer has been achieved. As one example, a desirable thickness may be achieved when the dielectric layer comprises a crystalline region and amorphous region as described above with respect to FIG. 2. This thickness may be achieved after a certain number of cycles have been repeated and the dielectric layer 430 comprises an amorphous region adjacent to the crystalline region.

The eventual transition of the dielectric layer 430 from the crystalline region (e.g., 200 in FIG. 2) to the amorphous region (e.g., 210 in FIG. 2) is a result of the dislocations shown in FIGS. 4A-4C (i.e., 410*b*, 420*b*, 410*c*, respectively). When the dielectric layer 430 is formed having a crystalline structure at the interface to the underlying Group III-V material of layer 400, the crystalline structure is maintained for a certain thickness of the dielectric layer 430 despite the mismatch between lattice constants of material forming the dielectric layer 430 and the Group III-V material forming the layer 400. As one example, an AlN dielectric layer (comprising of monolayers of Al and N) becomes amorphous after about 10 nanometers. In other embodiments, the thickness at which the dielectric layer may become amorphous depends on the disparity between lattice constants of the dielectric material and the underlying Group III-V material as well as the deposition conditions, such as temperature. For example, the proper deposition temperature depends on the chemistry of the first 410*a* and second 420*a* precursors. The process described above with respect to FIG. 3 may involve the use of any other material for the dielectric layer 430 as long as it has lattice constants that are appropriately mismatched from the underlying Group III-V material of layer 400.

As the dislocations (e.g., 410*b* of FIG. 4A, 420*b* of FIG. 4B, or 410*c* of FIG. 4C) increase after each repeated cycle of depositing monolayers (e.g., 410 of FIGS. 4A and 4C, 420 of FIG. 4B), the dielectric layer 430 becomes strained. The strain energy increases as the thickness of the dielectric layer 430 increases with each deposited monolayer. When the strain energy within the dielectric layer 430 becomes too high, more dislocations are formed to release the strain. As the number of dislocations increases, the crystal domains become smaller, and finally the dielectric layer transitions from a crystal region (e.g., 200 of FIG. 2) to an amorphous region (e.g., 210 of FIG. 2) when the crystal orientation can no longer be maintained as a result of the increased strain from the dislocations. The amorphous region (e.g., 210 of FIG. 2) is then formed in order to reduce the strain energy.

The desired thickness of the dielectric layer 430 may also include an interfacial layer 220 (as described above with respect to FIG. 2). The thickness of the interfacial region 220 may be controlled by cycling the precursors 410*a* and 410*b* as well as the controlling deposition temperature.

Once the desired thickness has been achieved, the ALD process is completed.

Thus, with the process described in FIG. 3, a single layer of dielectric material can be consistently and reliably deposited on Group III-V material systems with repeatable interface properties. The surface structure at the amorphous layer allows for an interface that is consistently reproducible and receptive to further processing. Because of its unique dual configuration of a crystalline and amorphous structure, the dielectric material possesses completely different material properties as a single uniform-structure dielectric material.

Another advantage of using the ALD system for depositing dielectric material is the threshold voltage uniformity in and between wafers. In the example involving using AlN as the dielectric material, as discussed above, the precursors of Al and N are employed in the ALD system alternatively so that one monolayer is deposited at a time which allows for very high uniformity of the dielectric layer. This high uniformity also allows precise control of the transition from crystalline structure to amorphous structure. This high uniformity and precise control allows for the formation of a semiconductor device having a uniform threshold voltage.

Figure 6:
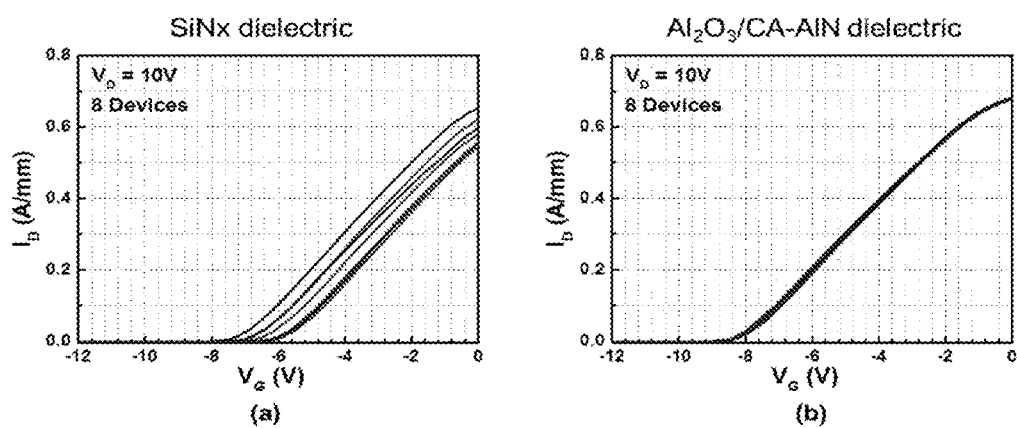
FIG. 6 provides an illustration comparing the FET characteristics two GaN MOSFETs fabricated with two different gate dielectric materials: (a) conventional SiNx and (b) composite $Al_2O_3$/CA-AlN.

The combination of a Group III-V material substrate with the dielectric material achieves voltage variances similar to those found in traditional silicon-based dielectric. FIG. 6 shows a comparison of the testing results of these two different combinations. The charts in FIG. 6 show the FET characteristics for a GaN MOSFET fabricated with two different gate dielectric materials: (a) one having a conventional SiNx material and (b) a second having a composite $Al_2O_3$/CA-AlN. To obtain the charts, a drain voltage of 10V is applied while the gate voltage is swept from −12V to 0V. The chart showing the MOSFET having the $Al_2O_3$/CA-AlN dielectric material shows uniform threshold voltages comparable to the conventional SiNx material.

An unexpected benefit is the enhancement of the conductivity of the material underlying the dielectric layer. In the example above using AlN as the dielectric material and AlGaN as the Group III-V material, the crystalline structure at the AlN/AlGaN interface can also be evidenced by the increase of electron concentration measured by Hall measurement technique as shown below in which a 10 nm thick CA-AlN is deposited on AlGaN material.

TABLE 1

| AlN Thickness (Å) | Al$_x$Ga$_{1-x}$N Thickness (Å) | Mobility (cm$^2$/Vs) | Sheet Resistance (ohm/sq) | Sheet Concentration |
|---|---|---|---|---|
| 0 | 100 | 2155 | 891 | −3.25E+12 |
| 104 | 100 | 1799 | 572 | −6.07E+12 |

Table 1 shows that the resistance of the material layer underlying the dielectric decreased which enhances the conductivity of the semiconductor. The increase of 2DEG concentration indicates the polarization effect of deposited AlN and its crystalline nature. The increase of 2DEG concentration shows the increase of the thickness of polarizing material.

Although AlN is used for illustration as one example for the dielectric material, other materials can be used as long as there is a difference in the lattice constants between the dielectric material and the underlying Group III-V material layer. For example, Al$_x$Ga$_{1-x}$N or In$_x$Ga$_{1-x}$N can have the same effects. As another example, CA-AlAs could be used on GaN based FETs and CA-AlP could be used on InP based FETs. Although ALD is used as a preferred method to deposit the dielectric material, other techniques could be used as long as crystalline quality material can be initiated at the beginning of the deposition process. In other words, other methods are acceptable as long as the method allows a crystalline layer to be initially deposited on the Group III-V material.

Other objects, advantages and embodiments of the various aspects will be apparent to those who are skilled in the field and are within the scope of the description and the accompanying figures. For example, but without limitation, structural or functional elements might be rearranged consistent with the foregoing disclosure. Similarly, principles according to the foregoing disclosure could be applied to other examples, which, even if not specifically described here in detail, would nevertheless be within the scope of the foregoing disclosure

What is claimed is:

1. A method of fabricating a single layer of dielectric material on a first III-V semiconductor layer, the method comprising:

forming the first III-V material semiconductor layer having a first lattice constant; and forming the single layer of dielectric material having a second lattice constant on the first III-V material semiconductor layer, the single layer of dielectric material comprising a first region located at a lower surface of the single layer of dielectric material, the forming of the single layer comprising depositing, by atomic layer deposition, at least one first monolayer of a first precursor on the first III-V material semiconductor layer, depositing, by atomic layer deposition, at least one second monolayer of a second precursor on the at least one first monolayer, wherein the first region is located at an interface between the single layer dielectric material and the first III-V material semiconductor layer, within the single layer of dielectric material, a mismatch between the first lattice constant and the second lattice constant causing the first region to transition to a second region that is adjacent to an upper surface of the single layer of dielectric material via an interfacial region, the upper surface being opposite to the lower surface, and further wherein the first region has a crystalline structure and the second region has an amorphous structure.

2. The method of claim 1, further comprising;

forming a second III-V material semiconductor layer between the first III-V material semiconductor layer and the single layer of dielectric material layer; and forming a 2-dimensional electron gas (2DEG) region at an interface of the first III-V material semiconductor layer and the second III-V material semiconductor layer.

3. The method of claim 1, further comprising:

forming the first III-V material semiconductor layer on a silicon substrate.

4. The method of claim 1, wherein the depositing steps occurs at a temperature between 200 degrees Celsius and 500 degrees Celsius.

5. The method of claim 1, wherein further comprising repeating the step of depositing of at least one first monolayer and at least one second monolayer of the dielectric material until a desired thickness of the single layer of dielectric material is reached.

6. The method of claim 1, wherein the transition from the first region to the second region occurs at a predetermined thickness of the single layer of dielectric material.

7. The method of claim 1, wherein the interfacial region has a first surface facing the first region and a second surface facing the second region, the interfacial region having an increasing dislocation size of the first precursor and the second precursor from the first surface to the second surface.

8. The method of claim 1, wherein the single layer of dielectric material comprises arsenide or phosphide.

9. The method of claim 1, wherein the single layer of dielectric material comprises AlN, AlGaN, InGaN, AlAs, or AlP.

* * * * *